United States Patent
Ko et al.

(10) Patent No.: US 12,027,570 B2
(45) Date of Patent: *Jul. 2, 2024

(54) DISPLAY DEVICE

(71) Applicant: LG DISPLAY CO., LTD., Seoul (KR)

(72) Inventors: SunWook Ko, Paju-si (KR); Hyunjin Kim, Paju-si (KR); KumMi Oh, Paju-si (KR); Seunghyo Ko, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/114,033

(22) Filed: Feb. 24, 2023

(65) Prior Publication Data

US 2024/0021659 A1    Jan. 18, 2024

Related U.S. Application Data

(63) Continuation of application No. 17/119,221, filed on Dec. 11, 2020, now Pat. No. 11,616,095.

(30) Foreign Application Priority Data

Dec. 18, 2019   (KR) .......................... 10-2019-0169598

(51) Int. Cl.
*H01L 27/15*   (2006.01)
*H01L 29/786*   (2006.01)
*H01L 33/62*   (2010.01)

(52) U.S. Cl.
CPC ...... *H01L 27/156* (2013.01); *H01L 29/78696* (2013.01); *H01L 33/62* (2013.01)

(58) Field of Classification Search
CPC . H01L 33/62; H01L 29/78696; H01L 27/156; H01L 27/1251; H01L 27/1214; H10K 59/1213; H10K 59/65; H10K 59/60
See application file for complete search history.

(56) References Cited

U.S. PATENT DOCUMENTS

| | | | |
|---|---|---|---|
| 11,616,095 B2* | 3/2023 | Ko | H10K 59/60 257/79 |
| 2017/0162111 A1 | 6/2017 | Kang et al. | |
| 2021/0020704 A1 | 1/2021 | Kim | |
| 2021/0184155 A1* | 6/2021 | Chae | H10K 59/353 |

FOREIGN PATENT DOCUMENTS

CN    107025875 A    8/2017

* cited by examiner

*Primary Examiner* — Changhyun Yi
(74) *Attorney, Agent, or Firm* — Birch, Stewart, Kolasch & Birch, LLP

(57) ABSTRACT

A display device can include a display panel including a first area and a second area surrounded by the first area, where each of the first area and the second area includes a plurality of subpixels. The display device can further include a plurality of first driving thin film transistors disposed respectively in the plurality of subpixels positioned in the first area, and a plurality of second driving thin film transistors disposed respectively in the plurality of subpixels positioned in the second area. The second area can include a transparent area. For at least one of the plurality of second driving thin film transistors, a length of the channel region of the second driving thin film transistor can be shorter than a length of the channel region of the first driving thin film transistor.

20 Claims, 10 Drawing Sheets

DISPLAY DEVICE

CROSS REFERENCE TO RELATED APPLICATION

This application is a Continuation Application of U.S. patent application Ser. No. 17/119,221, filed on Dec. 11, 2020 (now U.S. Pat. No. 11,616,095, issued on Mar. 28, 2023), which claims priority to the Korean Patent Application No. 10-2019-0169598, filed in the Republic of Korea on Dec. 18, 2019, where the entire contents of all these applications are hereby expressly incorporated by reference for all purposes as if fully set forth herein into the present application.

BACKGROUND

Field

Embodiments of the disclosure are related to display devices.

Discussion of Related Art

The growth of the information society leads to increased demand for display devices to display images and for use of various types of display devices, such as liquid crystal display devices, organic light emitting display devices, etc.

The display device can comprise a display panel in which a plurality of gate lines, a plurality of data lines and a plurality of subpixels are disposed, and can further comprise various driving circuits to drive the gate line and the data line or the like. The display panel can comprise an active area in which the plurality of subpixels are disposed and an image is displayed, and a non-active area which is located outside of the active area and in which a signal line or the like is disposed.

Here, the display device, according to types, can comprise a camera sensor or a proximity sensor (hereinafter, also referred to as "an optical sensor") disposed in the non-active area. The display device can provide more various functions by this optical sensor, but there is a limitation to reduce an area possessed by the non-active area in the display panel when the optical sensor is disposed in the non-active area.

Accordingly, a method to dispose the optical sensor or the like which is required in the display device in some area of the active area of the display panel is proposed, but there can be problems that an area in which the image is displayed is limited by a disposition of the optical sensor or a quality of the image can be deteriorated.

SUMMARY OF THE DISCLOSURE

Embodiments of the disclosure provide a method of disposing an optical sensor on an area overlapping an active area of a display panel while avoiding any reduction of an area for displaying an image in the active area of the display panel.

Embodiments of the disclosure provide a method of improving the entire quality of an image displayed through the active area in a structure where the optical sensor is disposed on an area overlapping the active area.

According to various embodiments of the disclosure, a display device comprises a display panel comprising a first area which has a first resolution and a second area which has a second resolution lower than the first resolution, a plurality of first thin film transistors disposed in each of a plurality of subpixels positioned in the first area, and a plurality of second thin film transistors disposed in each of a plurality of subpixels positioned in the second area.

Here, each of the plurality of first thin film transistors can comprise one gate electrode positioned on one surface of a channel region of the first thin film transistor, and each of the plurality of second thin film transistors can comprise a plurality of gate electrodes positioned on both surfaces of a channel region of the second thin film transistor.

Alternatively, a width of the channel region of the second thin film transistor can be greater than a width of the channel region of the first thin film transistor.

Alternatively, a ratio of a width to a length of the channel region of the second thin film transistor can be greater than a ratio of a width to a length of the channel region of the first thin film transistor.

And, the second thin film transistor can comprise a top gate electrode and a bottom gate electrode, and at least a part of a boundary of the top gate electrode can overlap to a boundary of the channel region of the second thin film transistor, and at least a part of a boundary of the bottom gate electrode can be positioned inside the boundary of the channel region of the second thin film transistor.

According to various embodiments of the disclosure, a display device comprises a display panel comprising a first area which has a first resolution and a second area which has a second resolution lower than the first resolution, a plurality of first thin film transistors disposed in each of a plurality of subpixels positioned in the first area, and a plurality of second thin film transistors disposed in each of a plurality of subpixels positioned in the second area, wherein a width of a channel region of the second thin film transistor is greater than a width of a channel region of the first thin film transistor.

According to various embodiments of the disclosure, a display device comprises a display panel comprising a first area where a plurality of first subpixels are disposed and a second area in which a plurality of second subpixels are disposed and which overlaps at least one optical sensor, a plurality of first thin film transistors disposed in each of the plurality of first subpixels, and a plurality of second thin film transistors disposed in each of the plurality of second subpixels, wherein at least one of a number and a shape of a gate electrode of the second thin film transistor is different from at least one of a number and a shape of a gate electrode of the first thin film transistor.

According to various embodiments of the disclosure, by increasing a transmittance via implementing a portion of the active area as a low resolution area, the optical sensor can be disposed on an area overlapping the low resolution area.

According to various embodiments of the disclosure, by implementing a current output performance of a driving transistor supplying a driving current to a light emitting element disposed in the low resolution area to be different from that of a driving transistor disposed in a high resolution area, the image quality of the display panel including the low resolution area and the high resolution area in the active area can be improved.

BRIEF DESCRIPTION OF THE DRAWINGS

The above and other objects, features, and advantages of the present disclosure will be more clearly understood from the following detailed description, taken in conjunction with the accompanying drawings, in which.

DETAILED DESCRIPTION OF THE EMBODIMENTS

Figure 1:
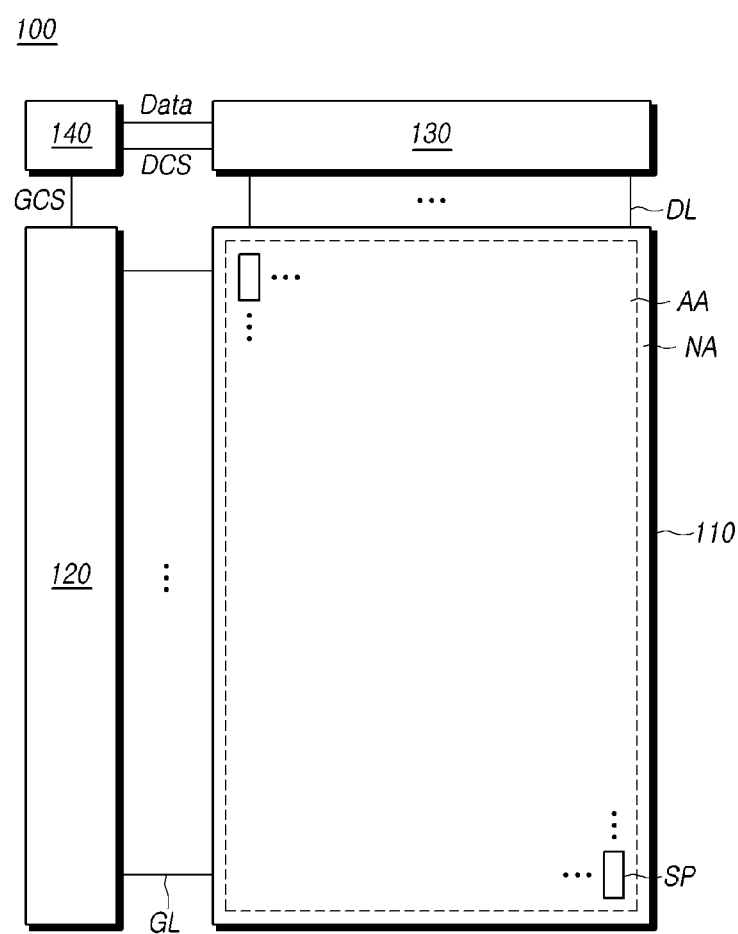
FIG. 1 is a view schematically illustrating a configuration of a display device according to various embodiments of the disclosure.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the description can make the subject matter in some embodiments of the present disclosure rather unclear. The terms such as "including", "having", "containing", "constituting", "comprising", "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" can be used herein to describe elements of the present disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element can be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms can be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that can be caused by various factors (e.g., process factors, internal or external impact, noise, etc.) even when a relevant description is not specified. Further, the term "may" fully encompasses all the meanings of the term "can". In addition, a phrase "overlapping to" is equivalent to "overlapping".

FIG. 1 is a view schematically illustrating a configuration of a display device 100 according to various embodiments of the disclosure. All the components of the display device according to all embodiments of the present disclosure are operatively coupled and configured.

Referring to FIG. 1, the display device 100 can comprise a display panel 110 which a plurality of subpixels SP are disposed, and a gate driving circuit 120, a data driving circuit 130, and a controller 140 for driving the display panel 110.

The display panel 110 can comprise an active area in which the plurality of subpixels SP are disposed and an image is displayed, and a non-active area NA which is located outside of the active area AA and in which a signal line or the like is disposed.

In the active area AA of the display panel 110, a plurality of gate lines GL and a plurality of data lines DL are disposed, and subpixels SP can be disposed on an area that the gate line GL and the data line DL are crossed.

Each of these subpixels SP can comprise a light emitting element ED (see FIG. 2), two or more subpixels SP can constitute one pixel.

The gate driving circuit 120 can be controlled by the controller 140 to sequentially output scan signals to the plurality of gate lines GL disposed in the display panel 110, controlling the driving timing of the subpixels SP.

The gate driving circuit 120 can comprise one or more gate driver integrated circuits (GDICs). Depending on driving schemes, the gate driving circuit 120 can be positioned on only one side, or each of two opposite sides, of the display panel 110.

The data driving circuit 130 receives image data from the controller 140 and converts the image data into an analog data voltage Vdata. The data driving circuit 130 outputs a data voltage Vdata to each data line DL according to the timing of applying a scan signal via the gate line GL, allowing each subpixel SP to represent a brightness according to the image data.

The data driving circuit 130 can comprise one or more source driver integrated circuits (SDICs).

The controller 140 supplies various control signals to the gate driving circuit 120 and the data driving circuit 130 and controls the operation of the gate driving circuit 120 and the data driving circuit 130.

The controller 140 enables the gate driving circuit 120 to output scan signals according to the timing of implementing each frame, converts image data received from the outside to meet the data signal format used by the data driving circuit 130, and outputs the resultant image data to the data driving circuit 130.

The controller 140 receives, from the outside (e.g., a host system), various timing signals including a vertical synchronization signal Vsync, a horizontal synchronization signal Hsync, an input data enable signal DE, and a clock signal CLK, along with the image data.

The controller 140 can generate a diversity of control signals using the timing signals received from the outside and output the control signals to the gate driving circuit 120 and the data driving circuit 130.

As an example, to control the gate driving circuit 120, the controller 140 outputs various gate control signals GCS comprising a gate start pulse (GSP), a gate shift clock (GSC), and a gate output enable signal (GOE).

The gate start pulse GSP controls the operation start timing of one or more gate driver integrated circuits (GDICs) constituting the gate driving circuit 120. The gate shift clock (GSC) is a clock signal commonly input to one or more gate driver integrated circuits (GDICs) and controls the shift timing of the scan signals. The gate output enable signal (GOE) designates timing information about one or more gate driver integrated circuits (GDICs).

To control the data driving circuit 130, the controller 140 outputs various data control signals DCS comprising, e.g., a source start pulse (SSP), a source sampling clock (SSC), and a source output enable signal (SOE).

The source start pulse (SSP) controls the data sampling start timing of one or more source driver integrated circuits (SDICs) constituting the data driving circuit 130. The source sampling clock (SSC) is a clock signal for controlling the sampling timing of data in each source driver integrated circuit (SDIC). The source output enable signal (SOE) controls the output timing of the data driving circuit 130.

The display device 100 can further comprise a power management integrated circuit that supplies various voltages or currents to, e.g., the display panel 110, the gate driving circuit 120, and the data driving circuit 130 or controls various voltages or currents to be supplied.

In the display panel 110, a voltage line or the like which various signals or voltages are supplied can be disposed besides the gate line GL and the data line DL. And in each subpixels SP, the light emitting element ED and a circuit element like as a thin film transistor for driving the light emitting element ED can be disposed.

Figure 2:
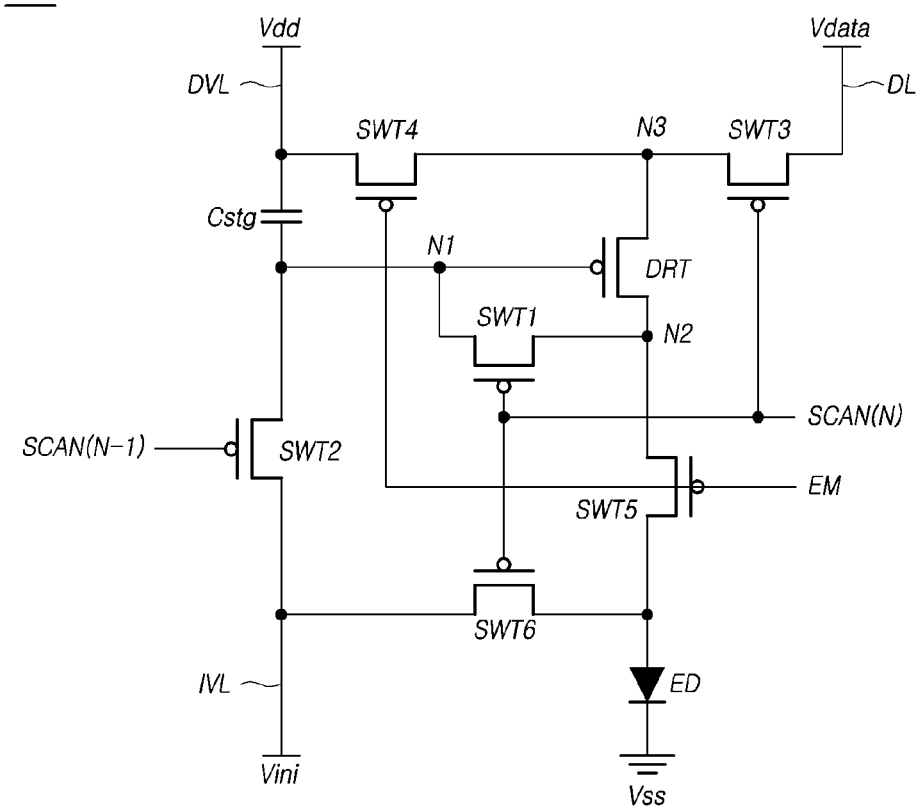
FIG. 2 is a view illustrating an example of a circuit structure and a driving timing of a subpixel included in the display device according to various embodiments of the disclosure.
Figure 2:
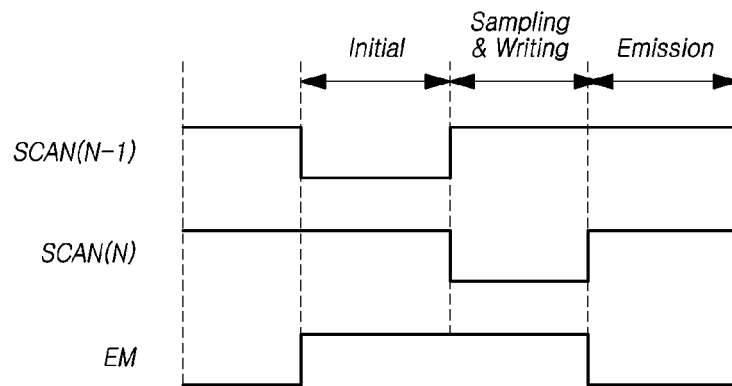

FIG. 2 is a view illustrating an example of a circuit structure and a driving timing of a subpixel SP included in the display device 100 according to various embodiments of the disclosure.

Referring to FIG. 2, the light emitting element ED can be disposed in the subpixel SP disposed on the display panel 110. Further a driving transistor DRT for driving the light emitting element ED by controlling of a current flowing through the light element ED can be disposed in the subpixel SP.

The light emitting element ED disposed in the subpixel SP can be an organic light emitting diode OLED, but, in some cases, can be a light emitting diode LED or a micro light emitting diode μLED.

Further, at least one thin film transistor besides the driving transistor DRT can be disposed in the subpixel SP, a storage capacitor Cstg for maintaining a voltage of a gate node of the driving transistor for one frame or the like can be disposed in the subpixel SP.

FIG. 2 illustrates an example of a 7T1C structure in which seven thin film transistors including the driving transistor DRT and one storage capacitor Cstg are disposed in the subpixel SP, but a structure of the subpixel SP included in the display device 100 according to various embodiments of the disclosure is not limited to this. Furthermore, FIG. 2 illustrates an example that the subpixel SP including thin film transistors of a PMOS type, but at least one thin film transistor disposed in the subpixel SP can be an NMOS type.

The light emitting element ED can comprise an anode electrode electrically connected to the driving transistor DRT and a cathode electrode that a base voltage Vss is supplied.

The driving transistor DRT can be electrically connected between a driving voltage line DVL that a driving voltage Vdd is supplied and the light emitting element ED. Furthermore, the driving transistor DRT can be electrically connected to the data line DL that the data voltage Vdata is supplied. And the gate node of the driving transistor DRT can be electrically connected to the storage capacitor Cstg and an initialization voltage line IVL.

A first switching transistor SWT1 can be controlled by the scan signal SCAN(N) and can be electrically connected between a first node N1 and a second node N2 of the driving transistor DRT. The first switching transistor SWT1 can control that a voltage which a threshold voltage Vth of the driving transistor DRT is compensated to the data voltage Vdata is applied to the gate node of the driving transistor DRT.

A second switching transistor SWT2 can be controlled by the scan signal SCAN(N−1) and can be electrically connected between the first node N1 of the driving transistor DRT and the initialization voltage line IVL. The second switching transistor SWT2 can be used to initialize a voltage of the gate node of the driving transistor DRT.

A third switching transistor SWT3 can be controlled by the scan signal SCAN(N) and can be electrically connected between a third node N3 of the driving transistor DRT and the data line DL. And a fourth switching transistor SWT4 can be controlled by the scan signal EM and can be electrically connected between the third node N3 of the driving transistor DRT and the driving voltage line DVL.

A fifth switching transistor SWT5 can be controlled by the scan signal EM and can be electrically connected between the second node N2 of the driving transistor DRT and the light emitting element ED. The fifth switching transistor SWT5 can control a light emitting timing of the light emitting element ED.

A sixth switching transistor SWT6 can be controlled by the scan signal SCAN(N) and can be electrically connected between the anode electrode of the light emitting element ED and the initialization voltage line IVL. The sixth switching transistor SWT6 can be used to initialize a voltage of the anode electrode of the light emitting element ED.

Describing a driving method of this subpixel SP, the subpixel SP can be driven in divided periods as an initialization period, a sampling & writing period and a light emitting period during one image frame period.

In the initialization period, the scan signal SCAN(N−1) of a low level can be supplied to the subpixel SP and the second switching transistor SWT2 can be turned-on. As the second switching transistor SWT2 is turned-on, an initialization voltage Vini can be applied to the gate node of the driving transistor DRT.

Finishing an initialization, the scan signal SCAN(N−1) of a high level and the scan signal SCAN(N) of a low level can be supplied to the subpixel SP in the data writing period. And the second switching transistor SWT2 can be turned-off. Furthermore, the first switching transistor SWT1, the third switching transistor SWT3 and the sixth switching transistor SWT6 can be turned-on.

As the first switching transistor SWT1 is turned-on, the first node N1 and the second node N2 of the driving transistor DRT are electrically connected.

Furthermore, as the third switching transistor SWT3 is turned-on, the data voltage Vdata can be applied to the first node N1 which is the gate node of the driving transistor DRT through the driving transistor DRT and the first switching transistor SWT1. At this time, a voltage that the threshold voltage Vth of the driving transistor DRT is reflected to the data voltage Vdata can be applied to the gate node of the driving transistor DRT, and a compensation to the threshold voltage Vth of the driving transistor DRT can be performed.

Moreover, as the sixth switching transistor SWT6 is turned-on in the data writing period, the anode electrode of the light emitting element ED can be initialized by the initialization voltage Vini. For example, a voltage application to the gate node of the driving transistor DRT and the initialization of the anode electrode of the light emitting element ED can be performed simultaneously.

The scan signal SCAN(N−1) of the high level and the scan signal SCAN(N) of a high level can be supplied in the light emitting period, and the scan signal EM of a low level can be supplied in the light emitting period. Accordingly, the first switching transistor SWT1, the third switching transistor SWT3 and the sixth switching transistor SWT6 can be turned-off, the fourth switching transistor SWT4 and the fifth switching transistor SWT5 can be turned-on.

As the fourth switching transistor SWT4 is turned-on, the driving voltage Vdd can be supplied to the third node N3 of the driving transistor DRT. Further, a voltage difference by the data voltage Vdata and the driving voltage Vdd is formed between the first node N1 and the third node N3 of the driving transistor DRT, a current according to the data voltage Vdata can flow through the driving transistor DRT.

As the fifth switching transistor SWT5 is turned-on, the current according to the data voltage Vdata is supplied to the light emitting element ED, the light emitting element ED can represent a brightness corresponding to the data voltage Vdata.

Subpixels SP can be disposed in the active area AA as constant distances, or as same number in a unit area, and the display panel 110 can represent a constant resolution.

Alternatively, in some cases, the subpixel SP can be disposed for some area of the active area AA to have a different resolution. In this case, the transmittance of an area which the resolution is low can be increased, an optical sensor or the like can be disposed on the area which the transmittance is increased and perform a sensing. For example, the area where an image is displayed and the optical sensor is disposed can be present in the active area AA.

Figure 3:
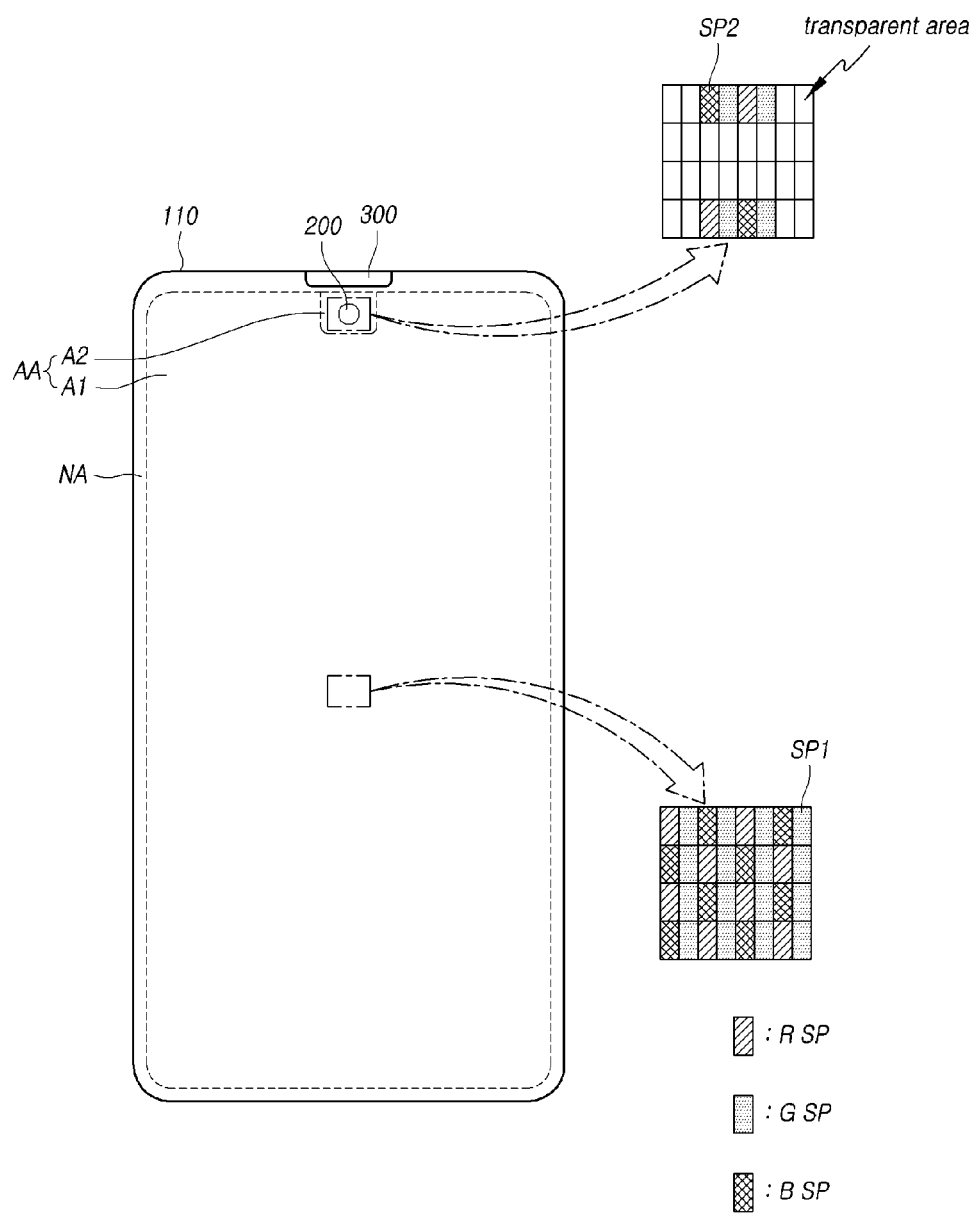
FIG. 3 is a view illustrating an example of a structure in which an optical sensor is disposed in an active area in the display device according to various embodiments of the disclosure.

FIG. 3 is a view illustrating an example of a structure in which an optical sensor 200 is disposed in an active area AA in the display device 100 according to various embodiments of the disclosure.

Referring to FIG. 3, the active area AA of the display panel 110 can comprise a first area A1 having a first resolution, and a second area A2 having a second resolution lower than the first resolution.

The first area A1 can be a most area of the active area AA. And the second area A2 can be an area excluding the first area A1 from the active area AA, and can be some area of the active area AA.

The second area A2, like as an example illustrated in FIG. 3, can be positioned at a center of an upper side of the active area AA, but is not limited to this. The second area A2 can be positioned on a left side portion or a right side portion in the upper side of the active area AA, or can be positioned on a portion separated from a boundary of the active area AA.

Since the first resolution of the first area A1 is higher than the second resolution of the second area A1, the number of a first subpixel SP1 disposed per the unit area in the first area A1 can be greater than the number of a second subpixel SP2 disposed per the unit area in the second area A2. Accordingly, a distance between the first subpixels SP1 disposed in the first area A1 can be smaller than a distance between the second subpixels SP2 disposed in the second area A2. Each subpixel can be red subpixel R SP, green subpixel G SP or blue subpixel B SP.

Alternatively, in some cases, the greatest distance among distances between the first subpixels SP1 disposed in the first area A1 can be smaller than the greatest distance among distances between the second subpixels SP2 disposed in the second area A2.

For example, like as an example illustrated in FIG. 3, some of the second subpixels SP2 disposed in the second area A2 can be disposed adjacently each other, and can be disposed separately from other parts.

In this way, as the second resolution of the second area A2 which is some area of the active area AA is lower than the first resolution of the first area A1 which is remaining area of the active area AA, the transmittance of the second area A2 can be higher than the transmittance of the first area A1.

For example, the light emitting element ED or a circuit element may be not disposed in an area except for an area where the second subpixel SP2 is disposed in the second area A2. Accordingly, the area except for the area where the second subpixel SP2 is disposed can be a transparent area or an area having a high transmittance.

Accordingly, the optical sensor 200 like as a camera sensor or a proximity sensor or the like can be disposed on an area overlapping to the second area A2 which the transmittance is high.

The optical sensor 200 can be disposed on the area overlapping to the second area A2, for example, can be positioned on a rear surface of a substrate of the display panel 110. For example, the optical sensor 200 can be positioned on an opposite side of a face on which the display device 100 displays an image.

As the optical sensor 200 is positioned on the opposite side of the face on which the image is displayed and on the area overlapping to the active area AA, the optical sensor 200 can be disposed without a decrease of the active area AA or an increase of the non-active area NA.

Since the transmittance of the second area A2 where the optical sensor 200 is disposed is high, a sensing function of the optical sensor 200 can be provided fully while the optical sensor 200 is disposed on the area overlapping to the active area AA.

For example, in a case that the camera sensor is disposed on the second area A2, since a photo sensing can be performed fully through the transparent area or the like of the second area A2, an image sensing function by the camera sensor can be provided.

Alternatively, the proximity sensor is disposed on the second area A2 and a proximity sensing function can be provided. And, in a case that the proximity sensor is disposed on the second area A2, a light source 300 emitting a light for the proximity sensing, for example, can be positioned on the non-active area NA of the display panel 110.

As the light source 300 for the proximity sensing is not disposed on the active area AA, the light emitted from the light source 300 may not influence the image displayed through the active area AA. And as the proximity sensor is disposed on the second area A2 that the transmittance is high, the proximity sensing function can be provided without an increase of the non-active area due to a disposition of the proximity sensor.

In this way, according to various embodiments of the disclosure, as disposing an area having a lower resolution compared to a periphery area to some area of the active area AA, and disposing the optical sensor 200 on an area overlapping to the some area, an optical sensing function by the optical sensor 200 positioned in the active area AA can be provided.

Furthermore, according to various embodiments of the disclosure, by disposing a thin film transistor for driving the subpixel SP to have different structures in the first area A1 having the first resolution and in the second area A2 in which the optical sensor 200 is disposed and which has the second resolution lower than the first resolution, uniformity of an image quality of a luminance can be maintained and a difference in the resolution between the first area A1 and the second area A2 can be minimized.

Figure 4:
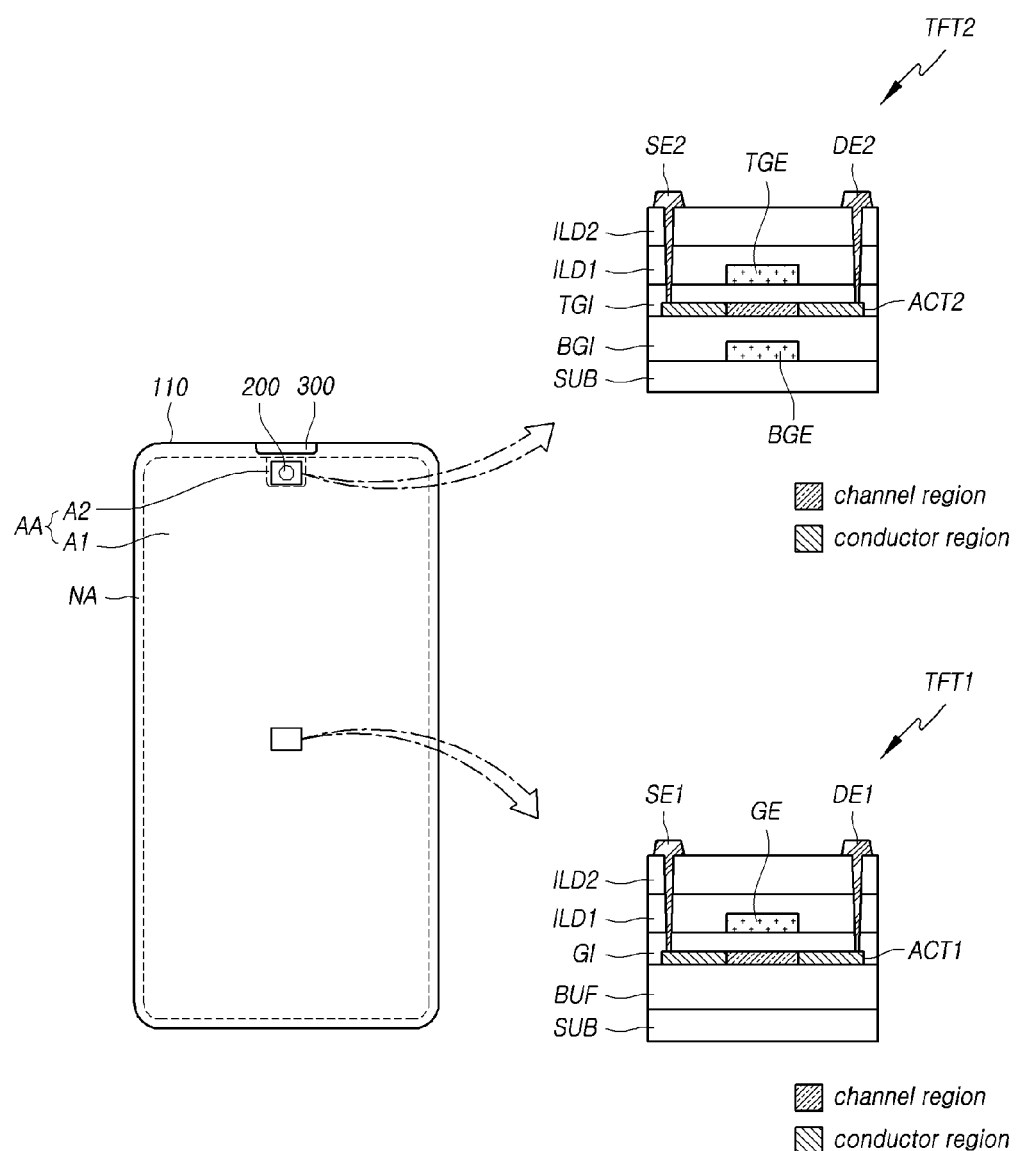
FIG. 4 is a view illustrating an example of a structure of a thin film transistor disposed in a high resolution area and a low resolution area in the display device according to various embodiments of the disclosure.

FIG. 4 is a view illustrating an example of a structure of a thin film transistor disposed in a high resolution area and a low resolution area in the display device 100 according to various embodiments of the disclosure. The thin film transistor illustrated in FIG. 4 can be the driving transistor DRT for controlling a supply of a driving current to the light emitting element ED disposed in the subpixel SP.

Referring to FIG. 4, a first thin film transistor TFT1 disposed on the first area A1 having the first resolution can comprise one gate electrode GE positioned on one surface of a first active layer ACT1 of the first thin film transistor TFT1.

A second thin film transistor TFT2 disposed on the second area A2 having the second resolution lower than the first resolution can comprise a plurality gate electrodes TGE, BGE positioned on both surfaces of a second active layer ACT2 of the second thin film transistor TFT2.

First, looking at a structure of the first area A1 where the first thin film transistor TFT1 is disposed, a buffer layer BUF can be disposed on a substrate SUB, and the first active layer ACT1 can be disposed on the buffer layer BUF. The first active layer ACT1 can comprise a channel region and a conductor region, and the channel region can be disposed to be corresponded to the gate electrode GE.

A gate insulation layer GI can be disposed on the first active layer ACT1, and the gate electrode GE can be disposed on the gate insulation layer GI. A first interlayer insulation layer ILD1 and a second interlayer insulation layer ILD2 can be disposed on the gate electrode GE, and a first source electrode SE1 and a first drain electrode DE1 can be disposed in a contact hole formed in several insulation layers disposed on the first active layer ACT1.

Comparing the structure of the second area A2 where the second thin film transistor TFT2 is disposed to the structure of the first area A1, in the second area A2, a bottom gate electrode BGE can be disposed on the substrate SUB.

A bottom gate insulation layer BGI can be disposed on the bottom gate electrode BGE, and the bottom gate insulation layer BGI can be a same layer with the buffer layer BUF disposed on the first area A1.

For example, only the second thin film transistor TFT2 disposed on the second area A2 can comprise the bottom gate electrode BGE. And no electrode is disposed under the first active layer ACT1 of the first thin film transistor TFT1 disposed on the first area A1.

The second active layer ACT2 and a top gate insulation layer TGI can be disposed on the bottom gate electrode BGE, and a top gate electrode TGE can be disposed on the top gate insulation layer TGI.

The top gate insulation layer TGI can be a same layer with the gate insulation layer GI disposed on the first area A1, and the top gate electrode TGE can be disposed on a same layer with the gate electrode GE disposed on the first area A1.

The first interlayer insulation layer ILD1 and the second interlayer insulation layer ILD2 can be disposed on the top gate electrode TGE, and a second source electrode SE2 and a second drain electrode DE2 can be disposed in a contact hole formed in an insulation layer or the like positioned on the second active layer ACT2.

The bottom gate electrode BGE can be electrically connected to the top gate electrode TGE. Alternatively, in some cases, in a state that the bottom gate electrode BGE is not electrically connected to the top gate electrode TGE, the bottom gate electrode BGE can be supplied with a same signal which is supplied to the top gate electrode TGE.

In this way, as the second thin film transistor TFT2 disposed on the second area A2 comprises the top gate electrode TGE and the bottom gate electrode BGE, a field formed in the channel region of the second active layer ACT2 can be increased, an amount of a current supplied by a driving of the second thin film transistor TFT2 can be increased.

Accordingly, as a current supplied to the light emitting element ED is increased by the driving transistor DRT disposed on the second area A2, a luminance represented by the second subpixel SP2 disposed on the second area A2 can be increased.

And, as the first thin film transistor TFT1 disposed on the first area A1 is driven by one gate electrode GE, an amount of a current that the first thin film transistor TFT1 supplies can be smaller than that of the second thin film transistor TFT2.

Accordingly, in a case that same data voltage Vdata is supplied, a luminance represented by the first subpixel SP1 disposed on the first area A1 can be lower than a luminance represented by the second subpixel SP2 disposed on the second area A2.

For example, a luminance that the second subpixel SP2 itself disposed on the second area A2 represents can be higher than a luminance that the first subpixel SP1 itself disposed on the first area A1 represents.

Here, since the second area A2 has a lower resolution than the first area A1, a luminance represented by the second area A2 and a luminance represented by the first area A1 can be uniform by making that the second subpixel SP2 represents a higher luminance than that of the first subpixel SP1. In other words, increasing only the luminance represented by the second subpixel SP2 disposed on the second area A2 by a structure difference between the first thin film transistor TFT1 and the second thin film transistor TFT2, it can be prevented to generate a deviation between a luminance represented by the low resolution area and a luminance represented by the high resolution area.

Furthermore, according to various embodiments of the disclosure, as implementing the channel region of the first thin film transistor TFT1 and that of the second thin film transistor TFT2 to be different, a luminance of the second area A2 can be compensated and a luminance deviation between the first area A1 and the second area A2 can be reduced.

Figure 5:
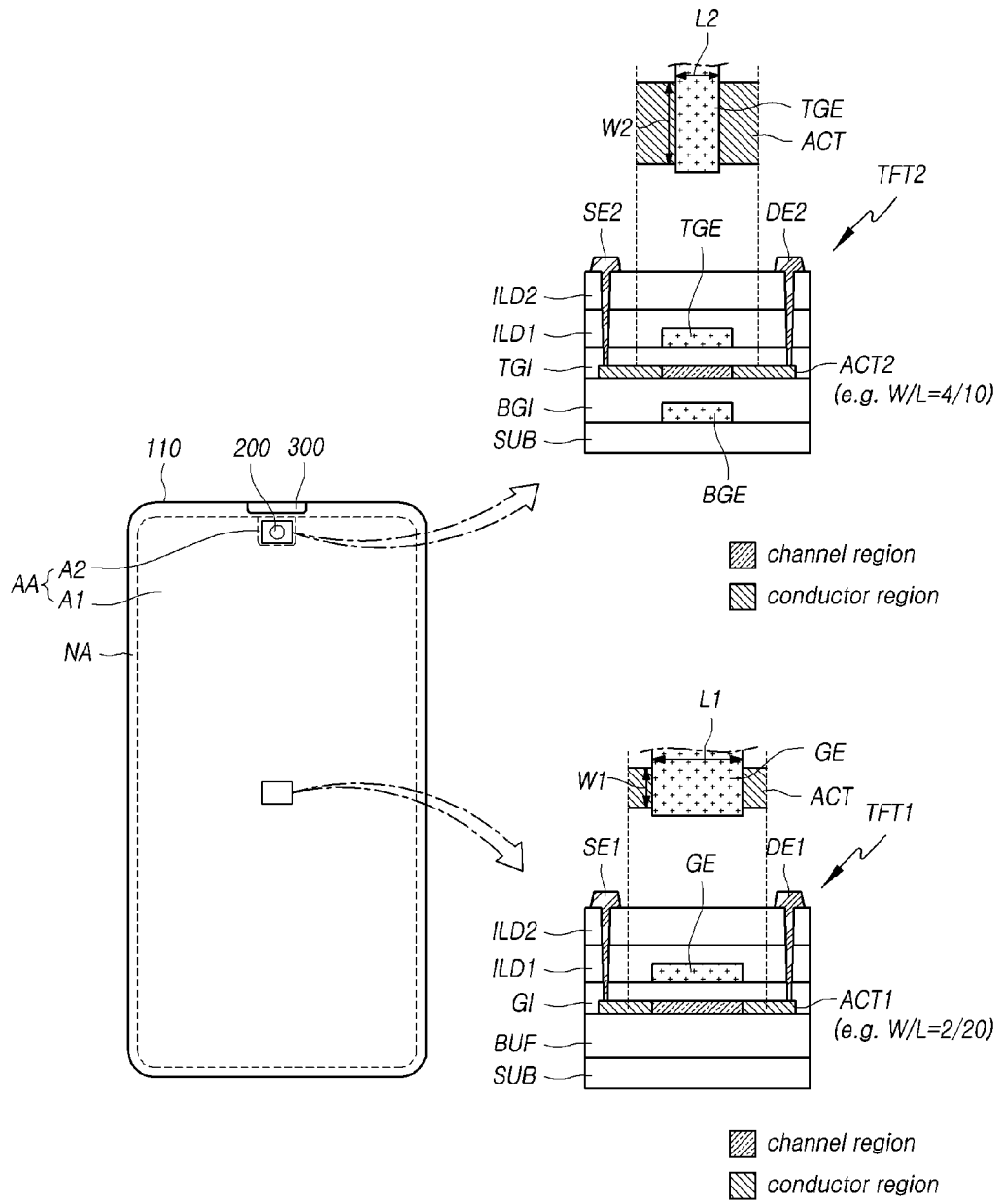
FIG. 5 is a view illustrating another example of a structure of the thin film transistor disposed in the high resolution area and the low resolution area in the display device according to various embodiments of the disclosure.

FIG. 5 is a view illustrating another example of a structure of the thin film transistor disposed in the high resolution area and the low resolution area in the display device 100 according to various embodiments of the disclosure.

Referring to FIG. 5, the first thin film transistor TFT1 disposed on the first area A1 having the first resolution can comprise one gate electrode GE. The second thin film transistor TFT2 disposed on the second area A2 having the second resolution lower than the first resolution can comprise the top gate electrode TGE and the bottom gate electrode BGE.

Here, a width W2 of the channel region in the second active layer ACT2 of the second thin film transistor TFT2 can be greater than a width W1 of the channel region in the first active layer ACT1 of the first thin film transistor TFT1.

Furthermore, a length L2 of the channel region in the second active layer ACT2 of the second thin film transistor TFT2 can be smaller than a length L1 of the channel region in the first active layer ACT1 of the first thin film transistor TFT1.

For example, the width W2 of the channel region of the second thin film transistor TFT2 can be greater than the width W1 of the channel region of the first thin film transistor TFT1, and the length L2 of the channel region of the second thin film transistor TFT2 can be smaller than the length L1 of the channel region of first thin film transistor TFT1.

Alternatively, a ratio (e.g., 4/10) of a width to a length of the channel region of the second thin film transistor TFT2 can be greater than a ration (e.g., 2/20) of a width to a length of the channel region of the first thin film transistor TFT1.

Here, since the channel region of the second thin film transistor TFT2 and the channel region of the first thin film transistor TFT1 are formed differently, a shape of the top gate electrode TGE of the second thin film transistor TFT2 and a shape of the gate electrode GE of the first thin film transistor TFT1 can be formed differently. For example, at least one of a number and the shape of the gate electrode TGE, BGE of the second thin film transistor TFT2 can be different from at least one of a number and the shape of the gate electrode GE of the first thin film transistor TFT1.

By increasing the width of the channel region of the second thin film transistor TFT2 disposed on the second area A2 and decreasing the length of the channel region of the second thin film transistor TFT2, a current supplied by the second thin film transistor TFT2 can be greater than a current supplied by the first thin film transistor TFT1.

Accordingly, a luminance of the second area A2 which is the low resolution area can be compensated, and a luminance deviation between the first area A1 and the second area A2 can be reduced.

Here, in some cases, the width of the channel region of the second thin film transistor TFT2 is increased and the length of the channel region of the second thin film transistor TFT2 is decreased, but an area of the channel region of the second thin film transistor TFT2 can be same or similar with an area of the channel region of the first thin film transistor TFT1. For example, an entire area of the active layer ACT is similarly disposed, and only current output performance of the thin film transistor can be implemented differently.

Furthermore, an example illustrated in FIG. 5 illustrates a case that the second thin film transistor TFT2 comprises both of the top gate electrode TGE and the bottom gate electrode BGE, but in some cases, in a structure that the second thin film transistor TFT2 comprises only the top gate electrode TGE or only the bottom gate electrode BGE, a luminance of the second area A2 can be compensated by adjusting the width and the length of the channel region of the second active layer ACT2.

And in a case that the second thin film transistor TFT2 comprises the top gate electrode TGE and the bottom gate electrode BGE, as disposing a structure of the top gate electrode TGE and a structure of the bottom gate electrode BGE differently, a current output characteristic of the second thin film transistor TFT2 can be improved.

Figure 6:
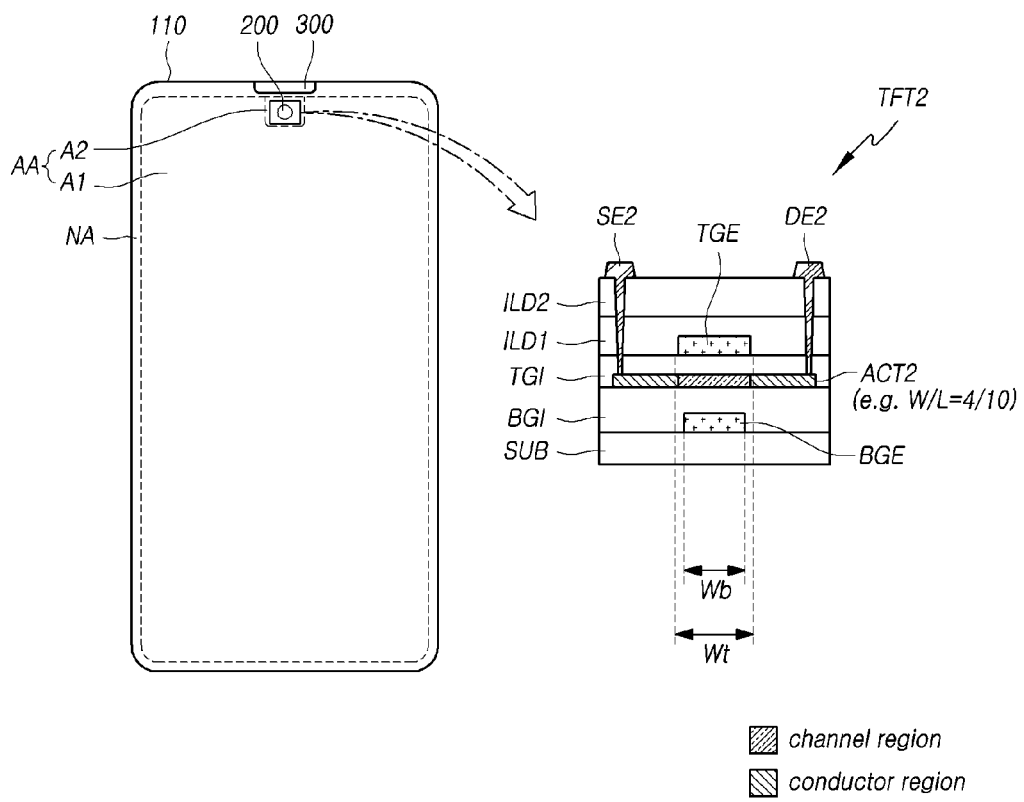
FIG. 6 is a view illustrating an example of a structure of a top gate electrode and a bottom gate electrode of the thin film transistor disposed in the low resolution area in the display device according to various embodiments of the disclosure.

FIG. 6 is a view illustrating an example of a structure of a top gate electrode TGE and a bottom gate electrode BGE of the thin film transistor disposed in the low resolution area in the display device 100 according to various embodiments of the disclosure.

Referring to FIG. 6, the second thin film transistor TFT2 disposed on the second area A2 which is the low resolution area can comprise the top gate electrode TGE positioned on the second active layer ACT2 and the bottom gate electrode BGE positioned under the second active layer ACT2.

Here, a boundary of at least one of the top gate electrode TGE and the bottom gate electrode BGE may not overlap to a boundary of the channel region of the second active layer ACT2.

At least a part of the boundary of the top gate electrode TGE can overlap to the boundary of the channel region of the second active layer ACT2. In a case that the top gate electrode TGE is disposed on the second active layer ACT2 and a process for forming the conductor region of the second active layer ACT2 is performed, the boundary of the top gate electrode TGE and the boundary of the channel region can be coincided.

Further, at least a part of the boundary of the bottom gate electrode BGE can be positioned on an area deviated from a line overlapped to the boundary of the channel region of the second active layer ACT2. Here, the boundary of the bottom gate electrode BGE can comprise the boundary disposed according to a direction of the channel region or the boundary disposed according to a direction crossing the channel region or the like. And the at least a part of the boundary of the bottom gate electrode BGE can mean at least one or a part of above mentioned boundaries.

For example, like as an example illustrated in FIG. 6, the boundary of the bottom gate electrode BGE can be positioned inside of the boundary of the channel region of the second active layer ACT2. Here, the boundary of the channel region can mean a boundary between the channel region and the conductor region in the second active layer ACT2. For example, the boundary of the bottom gate electrode BGE positioned inside of the boundary of the channel region of the second active layer ACT2 can mean the boundary disposed in a same direction with the boundary between the channel region and the conductor region among the boundaries of the bottom gate electrode BGE. And an example illustrated in FIG. 6 illustrates that both sides of the bottom gate electrode BGE are positioned inside the boundary of the channel region, only one side of the bottom gate electrode BGE can be positioned inside the boundary of the channel region.

Accordingly, Wb representing a width or a length of the bottom gate electrode BGE can be smaller than Wt representing a width or a length of the top gate electrode TGE.

As disposing the bottom gate electrode to be shorter than the channel region, a field formed in the channel region can be controlled and the current output characteristic of the second thin film transistor TFT2 can be stabilized.

Especially, in a case that the width of the channel region of the second thin film transistor TFT2 is increased and the length of the channel region of the second thin film transistor TFT2 is decreased for enhancing the current output performance of the second thin film transistor TFT2, the current output characteristic may not be stabilized due to a reduction of the length of the channel region.

In this case, by disposing the top gate electrode TGE as a same length with the channel region and disposing the bottom gate electrode BGE shorter than the channel region, a stable current output characteristic of the second thin film transistor TFT2 can be implemented while enhancing the current output performance of the second thin film transistor TFT2.

Figure 7:
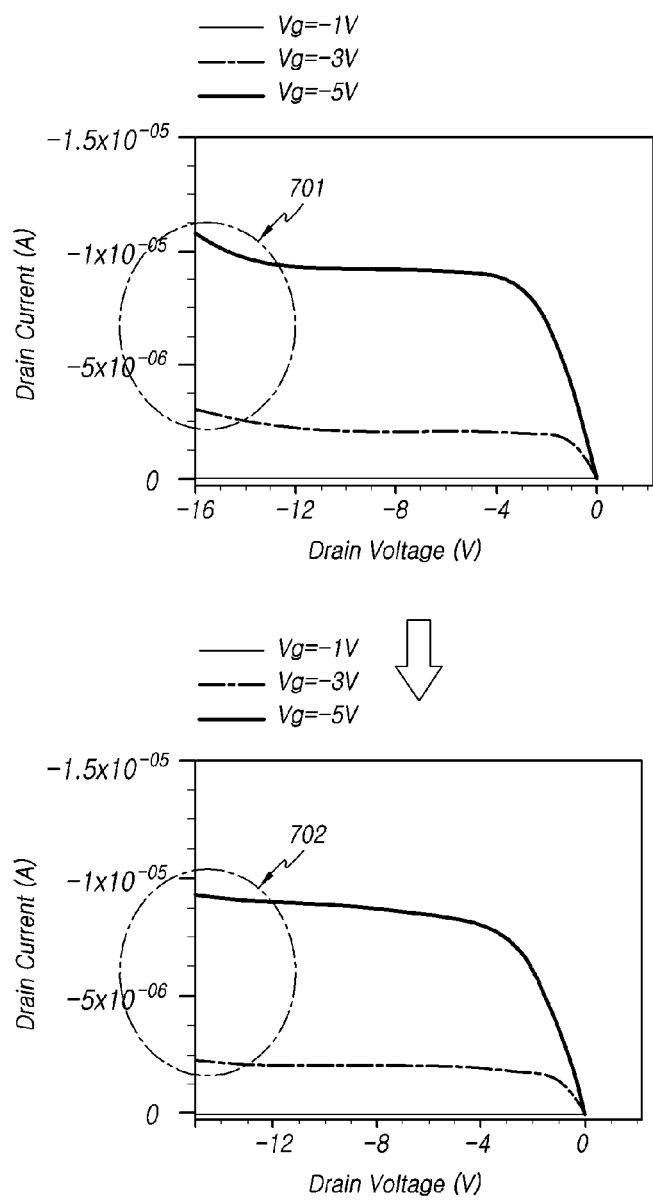
FIG. 7 is a view illustrating an example of a current output characteristic of the thin film transistor illustrated in FIG. 6.

FIG. 7 is a view illustrating an example of a current output characteristic of the thin film transistor illustrated in FIG. 6.

Referring to FIG. 7, in a case that the width of the channel region is increased and the length of the channel region is decreased for enhancing the current output performance of the second thin film transistor TFT2, it shows a result of measuring the current output of the second thin film transistor TFT2 while changing a gate voltage Vg supplied to the gate electrode TGE, BGE to −1V, −3V, and −5V.

In a case that both of the top gate electrode TGE and the bottom gate electrode BGE are disposed as a same length with the channel region, the current output performance is enhanced, but it is checked that a section which the current output is increasing sharply is present like as 701.

While, in a case that the bottom gate electrode BGE of the second thin film transistor TFT2 is disposed to be shorter than the channel region, it is checked that the current output characteristic is represented stably like as 702 while enhancing the current output performance.

In this way, according to various embodiments of the disclosure, as disposing the bottom gate BGE to be shorter than the channel region, the stable current output characteristic can be implemented while enhancing the current output performance of the second thin film transistor TFT2 disposed on the second area A2.

Alternatively, in some cases, when the structure of the channel region of the second thin film transistor TFT2 is different or the current output characteristic is stable, the bottom gate electrode BGE can be disposed to be longer than the channel region.

Figure 8:
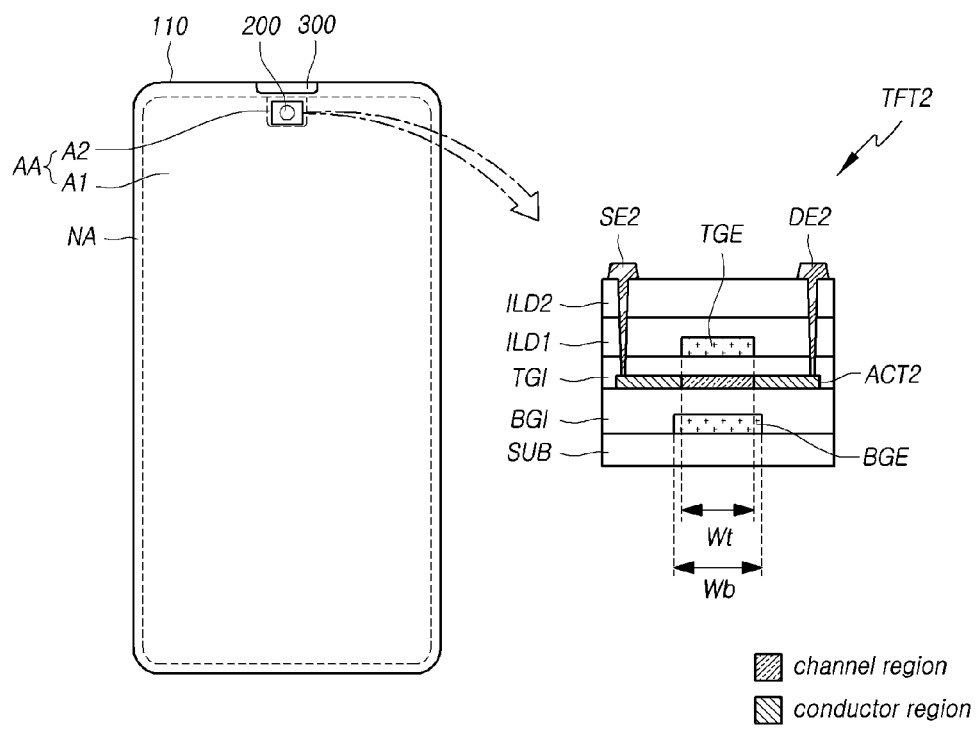
FIG. 8 is a view illustrating another example of a structure of the top gate electrode and the bottom gate electrode of the thin film transistor disposed in the low resolution area in the display device according to various embodiments of the disclosure.

FIG. 8 is a view illustrating another example of a structure of the top gate electrode TGE and the bottom gate electrode BGE of the thin film transistor disposed in the low resolution area in the display device 100 according to various embodiments of the disclosure.

Referring to FIG. 8, at least a part of the boundary of the top gate electrode TGE of the second thin film transistor TFT2 disposed on the second area A2 which is the low resolution area can overlap to the boundary of the channel region. For example, the length of the top gate electrode TGE and the length of the channel region can be same.

At least a part of the boundary of the bottom gate electrode BGE of the second thin film transistor TFT2 may not overlap to the boundary of the channel region, may be positioned outside the boundary of the channel region. Furthermore, the length of the bottom gate electrode BGE can be greater than the length of the channel region.

Accordingly, Wb representing the width or the length of the bottom gate electrode BGE can be greater than Wt representing the width or the length of the top gate electrode TGE.

As the bottom gate electrode BGE is disposed to be larger than an area overlapping to the channel region, the bottom gate electrode BGE can block that a light entered under the substrate SUB is reached to the channel region.

Especially, as the optical sensor 200 like as the camera sensor is disposed under the second thin film transistor TFT2, a light scattered by lens or the like of the camera sensor can be reflected to the channel region.

At this time, the bottom gate electrode BGE disposed to enhance the current output performance of the second thin film transistor TFT2 also performs a function blocking the light toward the channel region, the channel region can be protected and a luminance of the second area A2 can be enhanced.

In this way, according to various embodiments of the disclosure, the bottom gate electrode BGE is disposed additionally in the second thin film transistor TFT2 disposed on the second area A2 where the resolution is low, by adjusting the width and the length of the channel region, a luminance of the second area A2 can be compensated and a deviation with a luminance of the first area A1 can be reduced.

Furthermore, the current output characteristic of the second thin film transistor TFT2 can be stabilized or a function blocking an external light can be realized by adjusting the lengths between the bottom gate electrode BGE and the channel region.

This bottom gate electrode BGE can be implemented by adding an electrode layer which is not disposed on the first area A1, in some cases, can be implemented by using an electrode layer which is disposed on the first area A1.

Figure 9:
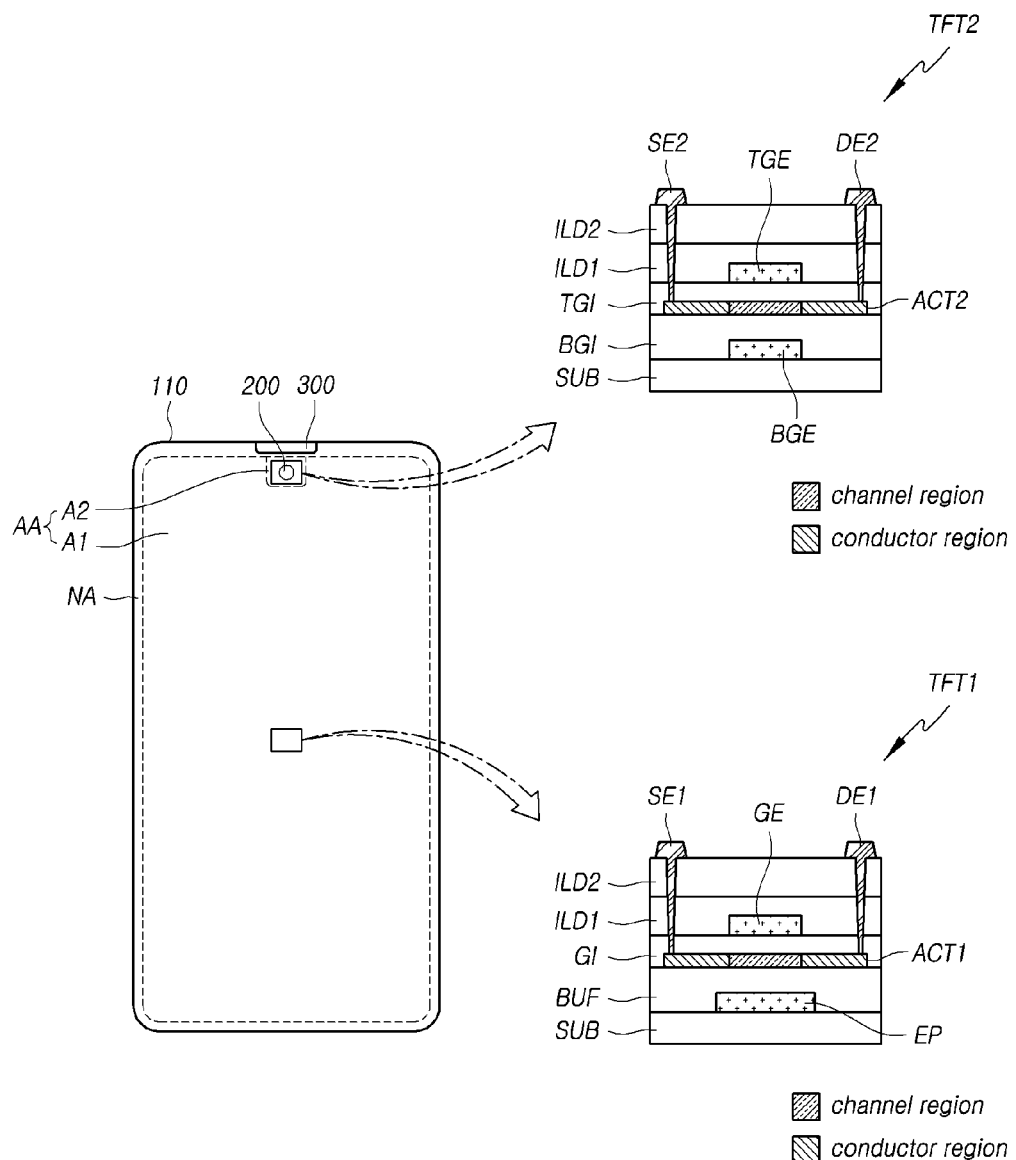
FIGS. 9 and 10 are views illustrating other examples of a structure of the thin film transistor disposed in the high resolution area and the low resolution area in the display device according to various embodiments of the disclosure.
Figure 10:
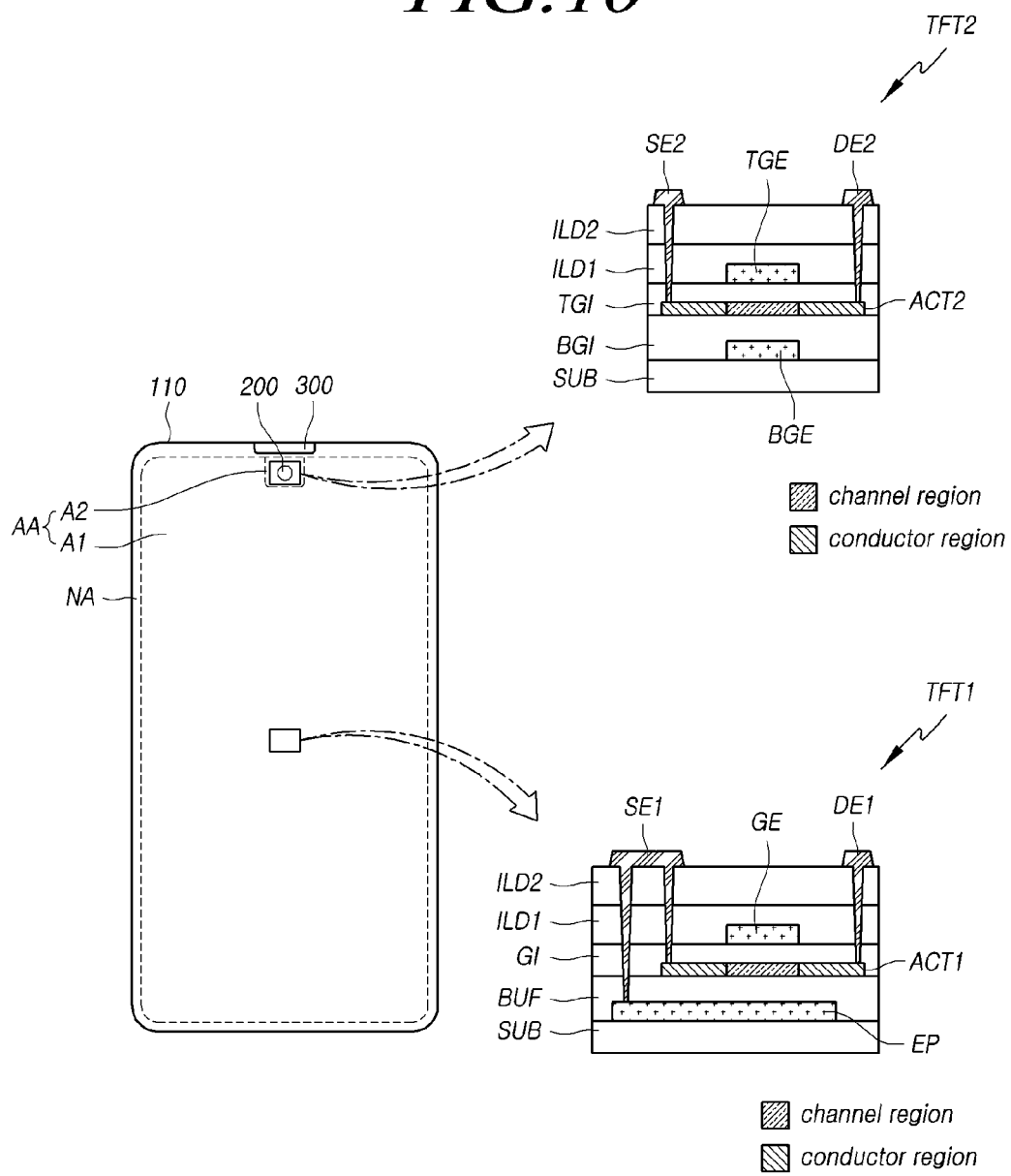

FIGS. 9 and 10 are views illustrating other examples of a structure of the thin film transistor disposed in the high resolution area and the low resolution area in the display device 100 according to various embodiments of the disclosure.

Referring to FIG. 9, the first thin film transistor TFT1 disposed on the first area A1 which is the high resolution area can comprise one gate electrode GE positioned on the first active layer ACT1.

And the second thin film transistor TFT2 disposed on the second area A2 which is the low resolution area can comprise the top gate electrode TGE positioned on the second active layer ACT2 and the bottom gate electrode BGE positioned under the second active layer ACT2.

A same signal which is supplied to the top gate electrode TGE can be supplied to the bottom gate electrode BGE. Furthermore, the bottom gate electrode BGE can be electrically connected to the top gate electrode TGE.

Further, in some cases, the width of the channel region of the second thin film transistor TFT2 can be greater than the width of the channel region of the first thin film transistor TFT1, and the length of the channel region of the second thin film transistor TFT2 can be smaller than the length of the channel region of the first thin film transistor TFT1.

Here, an electrode pattern EP insulated from the gate electrode GE can be disposed under the first active layer ACT1 of the first thin film transistor TFT1. And the electrode pattern EP, for example, can be a floating state that a signal is not supplied.

The electrode pattern EP can be disposed on an area including an area overlapping to the channel region of the first thin film transistor TFT1, for example, can be disposed to be larger than the channel region. As the electrode pattern EP is disposed to be overlapped to the channel region of the first thin film transistor TFT1, it can block that the external light is reached to the channel region.

And the electrode pattern EP disposed on the first area A1 can be positioned on a same layer with the bottom gate electrode BGE of the second thin film transistor TFT2 disposed on the second area A2.

Accordingly, the bottom gate electrode BGE of the second thin film transistor TFT2 can be made of a same material with the electrode pattern EP disposed under the first active layer ACT1 of the first thin film transistor TFT1.

In this way, in a case that the electrode pattern EP for light blocking function or the like is disposed on the first area A1, by implementing the bottom gate electrode BGE of the second thin film transistor TFT2 disposed on the second area A2 using the electrode layer of the electrode pattern EP, a structure for enhancing the current output performance of the second thin film transistor TFT2 can be implemented without adding a separate electrode layer.

Alternatively, in some cases, a certain signal can be supplied to the electrode pattern EP disposed under the first active layer ACT1 of the first thin film transistor TFT1.

For example, a constant voltage which is different from a signal supplied to the gate electrode GE of the first thin film transistor TFT1 can be supplied to the electrode pattern EP. As the constant voltage is supplied to the electrode pattern EP overlapping to the channel region of the first thin film transistor TFT1, a field formed in the channel region can be controlled by the electrode pattern EP. Accordingly, the electrode pattern EP can be used to implement the stable current output characteristic of the first thin film transistor TFT1.

For example, by using the electrode layer which is positioned on a same layer, the stable current output characteristic of the first thin film transistor TFT1 disposed on the first area A1 can be implemented and also an enhancement of the current output performance and the stable current output characteristic of the second thin film transistor TFT2 can be implemented.

The electrode pattern EP can be supplied with the constant voltage through a separate signal line, or the electrode pattern EP can be electrically connected to the first source electrode SE1 or the first drain electrode DE1 of the first thin film transistor TFT1 to be supplied with the certain signal.

Referring to FIG. 10, the electrode pattern EP can be disposed under the first active layer ACT1 of the first thin film transistor TFT1. And the electrode pattern EP can be disposed on a same layer with the bottom gate electrode BGE of the second thin film transistor TFT2 disposed on the second area A2.

Here, the electrode pattern EP can be electrically connected to the first source electrode SE1 of the first thin film transistor TFT1.

For example, on the same layer, it can be a structure that the electrode pattern EP disposed on the first area A1 can be electrically connected to the first source electrode SE1 and the bottom gate electrode BGE disposed on the second area A2 can be electrically connected to the top gate electrode TGE.

As the electrode pattern EP is electrically connected to the first source electrode SE1, a constant voltage which is supplied through the first source electrode SE1 can be applied to the electrode pattern EP. Here, the constant voltage applied to the electrode pattern EP, for example, can be the driving voltage Vdd.

Since the constant voltage which is different from a signal supplied to the gate electrode GE is supplied to the electrode pattern EP positioned under the first thin film transistor TFT1, the current output characteristic of the first thin film transistor TFT1 can be stabilized.

And by implementing the bottom gate electrode BGE of the second thin film transistor TFT2 using the electrode layer disposed on a same layer with the electrode pattern EP, the current output characteristic of the second thin film transistor TFT2 disposed on the second area A2 can be enhanced without adding a separate electrode layer.

Accordingly, a luminance of the second area A2 which is the low resolution area can be compensated, and a luminance deviation with the first area A1 which is the high resolution area can be reduced.

Furthermore, by disposing the optical sensor 200 on the rear surface of the display panel 110 overlapping the second area A2 which is implemented as the low resolution to have a high transmittance, the optical sensor 200 can be positioned in the active area AA of the display panel 100, and a deterioration of the image quality due to a disposition of the optical sensor 200 can be prevented.

The above description has been presented to enable any person skilled in the art to make and use the technical idea of the present invention, and has been provided in the context of a particular application and its requirements. Various modifications, additions and substitutions to the described embodiments will be readily apparent to those skilled in the art, and the general principles defined herein can be applied to other embodiments and applications without departing from the spirit and scope of the present invention.

The above description and the accompanying drawings provide an example of the technical idea of the present invention for illustrative purposes only. For example, the disclosed embodiments are intended to illustrate the scope of the technical idea of the present invention. Thus, the scope of the present invention is not limited to the embodiments shown, but is to be accorded the widest scope consistent with the claims. The scope of protection of the present invention should be construed based on the following claims, and all technical ideas within the scope of equivalents thereof should be construed as being included within the scope of the present invention.

What is claimed is:

1. A display device, comprising:
    a display panel comprising a first area and a second area adjacent to the first area, each of the first area and the second area including a plurality of subpixels;
    a plurality of first driving thin film transistors disposed respectively in the plurality of subpixels positioned in the first area; and
    a plurality of second driving thin film transistors disposed respectively in the plurality of subpixels positioned in the second area,
    wherein the second area further includes a transparent area, and
    wherein for at least one of the plurality of second driving thin film transistors, a length of a channel region of the second driving thin film transistor is shorter than a length of a channel region of a corresponding first driving thin film transistor among the plurality of first driving thin film transistors.

2. The display device of claim 1, wherein the first area has a first resolution and the second area has a second resolution lower than the first resolution.

3. The display device of claim 1, wherein each of the plurality of first driving thin film transistors comprises one gate electrode positioned on one surface of a channel region of the first driving thin film transistor, and each of the plurality of second driving thin film transistors comprises a plurality of gate electrodes positioned on surfaces of a channel region of the second driving thin film transistor.

4. The display device of claim 1, wherein for at least one of the plurality of second driving thin film transistors, the second driving thin film transistor comprises a top gate electrode positioned on the channel region of the second driving thin film transistor and a bottom gate electrode positioned under the channel region of the second driving thin film transistor.

5. The display device of claim 4, wherein a length of the top gate electrode is longer than the length of the channel region of the second driving thin film transistor, and a length of the bottom gate electrode is shorter than the length of the channel region of the second driving thin film transistor.

6. The display device of claim 4, wherein at least a part of a boundary of the bottom gate electrode is positioned outside a boundary of the channel region of the second driving thin film transistor.

7. The display device of claim 4, wherein at least a part of a boundary of the top gate electrode is overlapped to a boundary of the channel region of the second driving thin film transistor.

8. The display device of claim 1, further comprising an optical sensor positioned under the second driving thin film transistor in the second area.

9. The display device of claim 8, wherein the optical sensor comprises at least one of a camera sensor and a proximity sensor.

10. The display device of claim 1, further comprising:

a proximity sensor for proximity sensing, which is positioned under the second driving thin film transistor in the second area; and a light source for emitting a light for proximity sensing, which is positioned in a non-active area outside of the first and the second areas.

11. A display device, comprising:

a display panel comprising a first area where a plurality of first subpixels are disposed and a second area where a plurality of second subpixels are disposed, wherein the second area is overlapped with at least one optical sensor;

a plurality of first driving thin film transistors disposed respectively in the plurality of first subpixels; and a plurality of second driving thin film transistors disposed respectively in the plurality of second subpixels, wherein for at least one of the plurality of second driving thin film transistors, a ratio of a width to a length of a channel region of the second driving thin film transistor is greater than a ratio of a width to a length of a channel region of at least one of the plurality of first driving thin film transistors.

12. The display device of claim 11, wherein at least one of a number and a shape of a gate electrode of one of the plurality of second driving thin film transistors is different from at least one of a number and a shape of a gate electrode of one of the plurality of first driving thin film transistors.

13. The display device of claim 11, wherein when same data voltages are supplied to one of the plurality of first subpixels and one of the plurality of second subpixels, a luminance shown by the one of the plurality of second subpixels is higher than a luminance shown by the one of the plurality of first subpixels.

14. The display device of claim 11, wherein a greatest distance among distances between the plurality of second subpixels is greater than a greatest distance among distances between the plurality of first subpixels.

15. The display device of claim 11, wherein for at least one of the plurality of second driving thin film transistors, the second driving thin film transistor comprises a top gate electrode positioned on the channel region of the second driving thin film transistor and a bottom gate electrode positioned under the channel region of the second driving thin film transistor.

16. The display device of claim 15, further comprising an electrode pattern for blocking an external light disposed on an area including an area overlapping the channel region of the at least one of the plurality of first driving thin film transistors.

17. The display device of claim 16, wherein the electrode pattern is a floating state, or a different signal from a signal supplied to a gate electrode of the at least one of the plurality of first driving thin film transistors is supplied to the electrode pattern.

18. The display device of claim 15, further comprising an electrode pattern disposed on an area including an area overlapping the channel region of the at least one of the plurality of first driving thin film transistors, wherein the bottom gate electrode is electrically connected to the top gate electrode, and wherein the electrode pattern is electrically connected to a source electrode or a drain electrode of the at least one of the plurality of first driving thin film transistors.

19. The display device of claim 18, wherein a gate electrode of the at least one of the plurality of first driving thin film transistors is positioned on a same layer with the top gate electrode, and wherein the electrode pattern is positioned on a same layer with the bottom gate electrode.

20. The display device of claim 11, wherein the at least one optical sensor comprises at least one of a camera sensor and a proximity sensor.

* * * * *